United States Patent [19]
Gambino et al.

[11] Patent Number: 5,973,385
[45] Date of Patent: Oct. 26, 1999

[54] METHOD FOR SUPPRESSING PATTERN DISTORTION ASSOCIATED WITH BPSG REFLOW AND INTEGRATED CIRCUIT CHIP FORMED THEREBY

[75] Inventors: Jeffrey Peter Gambino, Gaylordsville, Conn.; Son Van Nguyen, San Jose, Calif.; Reinhard Stengl, Stadtbergen, Germany

[73] Assignees: International Business Machines Corporation, Armonk, N.Y.; Siemens Aktiengesellschaft, Munich, Germany

[21] Appl. No.: 08/736,301

[22] Filed: Oct. 24, 1996

[51] Int. Cl.⁶ .................................................. H01L 23/58
[52] U.S. Cl. .......................... 257/644; 257/650; 257/760; 428/210
[58] Field of Search ..................................... 257/644, 650, 257/760; 428/210

[56] References Cited

U.S. PATENT DOCUMENTS

| | | | |
|---|---|---|---|
| 3,967,310 | 6/1976 | Horiuchi et al. | 257/644 |
| 4,582,745 | 4/1986 | Schnable | 428/209 |
| 4,795,718 | 1/1989 | Beitman et al. | 437/41 |
| 5,169,801 | 12/1992 | Sato | 437/195 |
| 5,235,202 | 8/1993 | Yee et al. | 257/650 |
| 5,310,720 | 5/1994 | Shin et al. | 437/231 |
| 5,424,570 | 6/1995 | Sardella et al. | 257/644 |
| 5,441,765 | 8/1995 | Ballance et al. | 427/228 |
| 5,795,826 | 8/1998 | Gambino et al. | 438/692 |

*Primary Examiner*—William Krynski
*Assistant Examiner*—Cathy F. Lam
*Attorney, Agent, or Firm*—Schmeiser, Olsen & Watts

[57] ABSTRACT

Significant amounts of pattern distortion were found to be the result of reflowing borophosphosilicate glass (BPSG) and silicon dioxide shrinkage during high temperature junction anneals. In order to remedy this problem, a method for suppressing the pattern distortion by subjecting the wafer coated with BPSG and with silicon dioxide layers to a high temperature anneal before patterning is disclosed. The high temperature anneal densifies the undoped silicon dioxide before patterning, so that shrinkage of the undoped silicon dioxide does not affect the patterning steps.

17 Claims, 3 Drawing Sheets

METHOD FOR SUPPRESSING PATTERN DISTORTION ASSOCIATED WITH BPSG REFLOW AND INTEGRATED CIRCUIT CHIP FORMED THEREBY

BACKGROUND OF THE INVENTION

1. Technical Field

This invention relates generally to the manufacture of integrated circuit (IC) chips and, more specifically, to a method for suppressing pattern distortion associated with the reflow of borophosphosilicate glass (BPSG) dielectric layers during the annealing process of subsequent layers.

2. Background Art

In the present era of very large scale integration and ultra large-scale integration, new techniques are continuously being developed to more efficiently utilize the space within semiconductor devices while maintaining or improving present production efficiency, i.e., reducing the number of IC chips that fail because of various mistakes that may occur during the production process.

In the manufacture of IC chips, interconnecting contacts are provided between the active semiconductive material, in which the semiconductor devices are formed, and the interconnect lines. These contacts are typically formed by initially depositing a borophosphosilicate glass (BPSG) dielectric layer over the semiconductor devices. The BPSG material is chosen because it is an acceptable insulator that is capable of being flowed over the devices. The flowability of the material is necessary because the devices present a relatively high aspect ratio and all areas between the devices must be filled without the formation of voids. It was noted early on that BPSG, after reflow, filled a higher proportion of voids than other insulative materials.

The contacts and interconnects are formed by using a dual damascene process. A semi-conductor substrate having devices such as field effect transistors, gates and diodes is provided. The BPSG is deposited over the substrate and associated topography, reflowed to fill high aspect ratio features, then planarized with a chemical-mechanical polish (CMP). A low temperature oxide layer is deposited over the BPSG layer and serves as a polish stop during patterning of subsequent metal layers. A masking layer of photoresist is then provided over the oxide and patterned for exposing the underlying oxide in the contact areas. The exposed oxide and BPSG is then etched, forming contact holes. A second masking layer is provided over the oxide and patterned for exposing the underlying oxide in the interconnect areas. The exposed oxide is then etched, forming troughs for the interconnects. Conducting layers such as aluminum or tungsten are deposited over the wafer by non-selective deposition filling the holes and troughs. The conducting layer is then patterned by CMP to simultaneously form interconnects and contacts.

In a similar fashion, junctions are self-aligned with the contacts by performing the implantation step after the contacts have been etched but prior to the deposition of the conducting layer. The implantation typically involves a high energy ion implant and a high temperature anneal.

A problem with this approach is that distortion of the first contact and interconnect levels can occur during the high temperature junction activation anneal, due to shrinkage of the low temperature oxide and reflow of the BPSG. This distortion can lead to misalignment with subsequent contact levels (which can cause opens or shorts) and variations in interconnect resistance.

SUMMARY OF THE INVENTION

It is an advantage of the present invention that misalignment problems and variations in resistance are reduced. This reduction is achieved by subjecting the BPSG and undoped oxide to a high temperature before the patterning of the lines, the etching of the contacts and the ion implantation steps. This causes the borophosphosilace (BPSG) and the overlying oxide to densify prior to patterning. Therefore, the shrinkage occurs before the pattern is formed and results in straighter lines which will then be more easily alignable with subsequent layers.

Numerous other advantages and features of the present invention will become readily apparent from the following detailed description of the invention, the figures and the appended claims.

BRIEF DESCRIPTION OF THE DRAWINGS

The preferred exemplary embodiments of the present invention will hereinafter be described in conjunction with the appended drawings, where like designations denote like elements and.

DETAILED DESCRIPTION OF THE PREFERRED EMBODIMENTS

Figure 1:
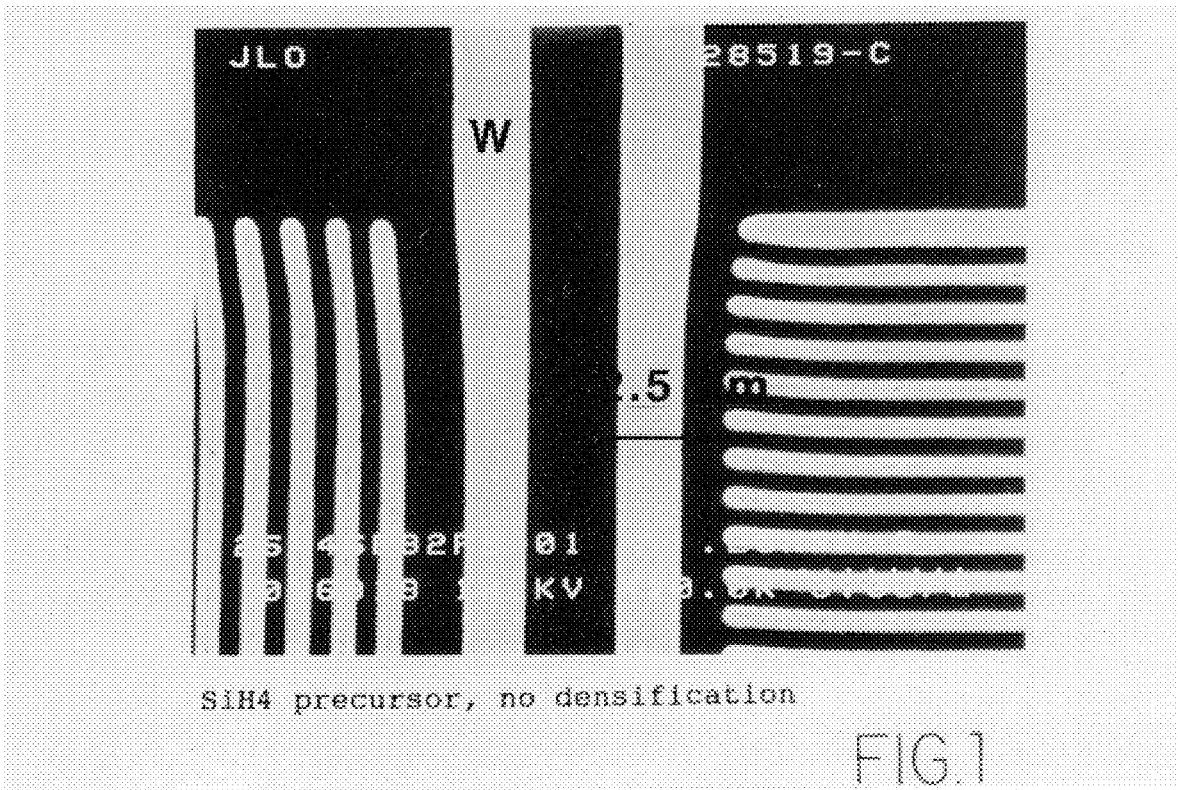
FIG. 1 is a scanning electron micrograph of lines formed using silane as the precursor for plasma enhanced chemical vapor deposition of silicon dioxide, without utilizing the method of the present invention.

Patterning of interconnects by chemical mechanical polishing (CMP) of metals (i.e., damascene patterning) is being increasingly used in the microelectronics industry. There are a number of advantages to the damascene process, including a low cost, global planarity, simple oxide deposition (no topography), simple reactive ion etching (RIE) of silicon dioxide ($SiO_2$)is easier than RIE of metals), and higher yields. Dual damascene (where the studs and interconnects are formed with the same metal deposition and polishing steps) has an additional cost advantage over single damascene processes, because metal deposition and polishing steps for forming the studs are eliminated.

In the previous studies on dual damascene, the via and interconnect structures were formed in one dielectric. However, when making contacts to silicon in 256 Megabit (M) dynamic random access memory (DRAM) devices, it was necessary to use two different dielectrics in the dual damascene structure. For the lower dielectric layer, borophosphosilicate glass (BPSG) or another flowable dielectric material, was used to fill the high aspect ratio spaces between gates in the array. However, it was difficult to fabricate damascene structures in BPSG, due to the high polish rate of BPSG. Severe erosion of the BPSG can occur during metal CMP, creating topography that can trap metal at subsequent CMP steps. On the other hand, non-flowable dielectric materials, such as undoped $SiO_2$, polish more slowly and the polish is therefore more controllable. Hence, undoped $SiO_2$ was used as the upper dielectric layer material, to minimize insulator erosion during metal CMP.

Unfortunately, there are a number of problems created by using undoped $SiO_2$ on BPSG for dual damascene. One problem is reflow of the BPSG during contact anneals, which can distort studs and interconnects. While looking at scanning electron micrographs of semiconductor devices, such as those shown in FIGS. 1 and 3, it was observed that the lines were not straight. It was then determined that the curvature in the lines was caused by the reflow of the borophosphosilicate glass (BPSG) and silicon dioxide shrinkage during the high temperature anneal of the junctions.

In order to overcome this problem, the present invention provides methods by which the undoped silicon dioxide layer may be processed and/or chosen. A first solution to the problem of line variation is to make the undoped silicon dioxide more dense before the patterning steps. This may be accomplished by subjecting the structure to a high temperature anneal that is comparable to the junction activation anneal temperature, i.e., from about 800 to about 1100° Celsius (C). By densifying the undoped silicon dioxide prior to patterning, the shrinkage of the layer occurs before the patterning steps. Hence, there is minimal distortion of lines and contacts.

Another solution to the line variation problem is to use an undoped, i.e., non-flowable, dielectric that does not shrink and/or becomes more compressive during the high temperature annealing process. It was observed that an oxide deposited by plasma enhanced chemical vapor deposition (PECVD) from a tetraethyl orthosilicate (TEOS) precursor has higher density (and hence less shrinkage) than one deposited from a silane precursor. Of course, any other process that provides a dense, as-deposited oxide could also be used.

EXAMPLE

Experiments were conducted on 0.25 μm structures used in developing a 256M DRAM process. After gate patterning and silicon nitride ($Si_3N_4$) liner deposition, BPSG was deposited and planarized by CMP. Borderless contacts in the array were etched and filled with doped polysilicon, that was then patterned by CMP to form polysilicon studs. A dual damascene process was used to form bordered contacts to all gates and to the diffusions in the support circuits, as well as tungsten (W) interconnects. The dual damascene process starts with deposition of undoped $SiO_2$ by plasma enhanced chemical vapor deposition (PECVD). Bordered contacts to all gates and to the diffusions in the support circuits were fabricated using lithography and RIE, with the etch stopping on the gate conductor or Si substrate, respectively. Troughs for interconnects were then patterned using lithography and RIE, with some over-etch into the BPSG to expose the top of the polysilicon studs in the array. After patterning the contacts and troughs, the contacts to diffusions were implanted with either arsenic (As) or boron difluoride ($BF_2$) and annealed, to provide low contact resistance. The contact implant process provides a number of advantages compared to using deep junctions after a spacer etch; the high dose implant is limited to a relatively small area resulting in low junction leakage, no dopant is lost during the contact etch resulting in low junction leakage, and the deep junction under the contact is relatively far from the channel resulting in good control of the threshold voltage. However, the high temperature anneal associated with this process can cause problems with BPSG reflow, as will be discussed below. A titanium/titanium nitride (Ti/TiN) barrier was formed in the contacts and troughs by physical vapor deposition (PVD) and annealing, then tungsten (W) was deposited by chemical vapor deposition (CVD) to fill the structures. Finally, the metal layers were patterned by CMP, forming W studs and W interconnects. In the 256M DRAM process, two additional Al interconnect levels were formed after the W dual damascene process.

Figure 3:
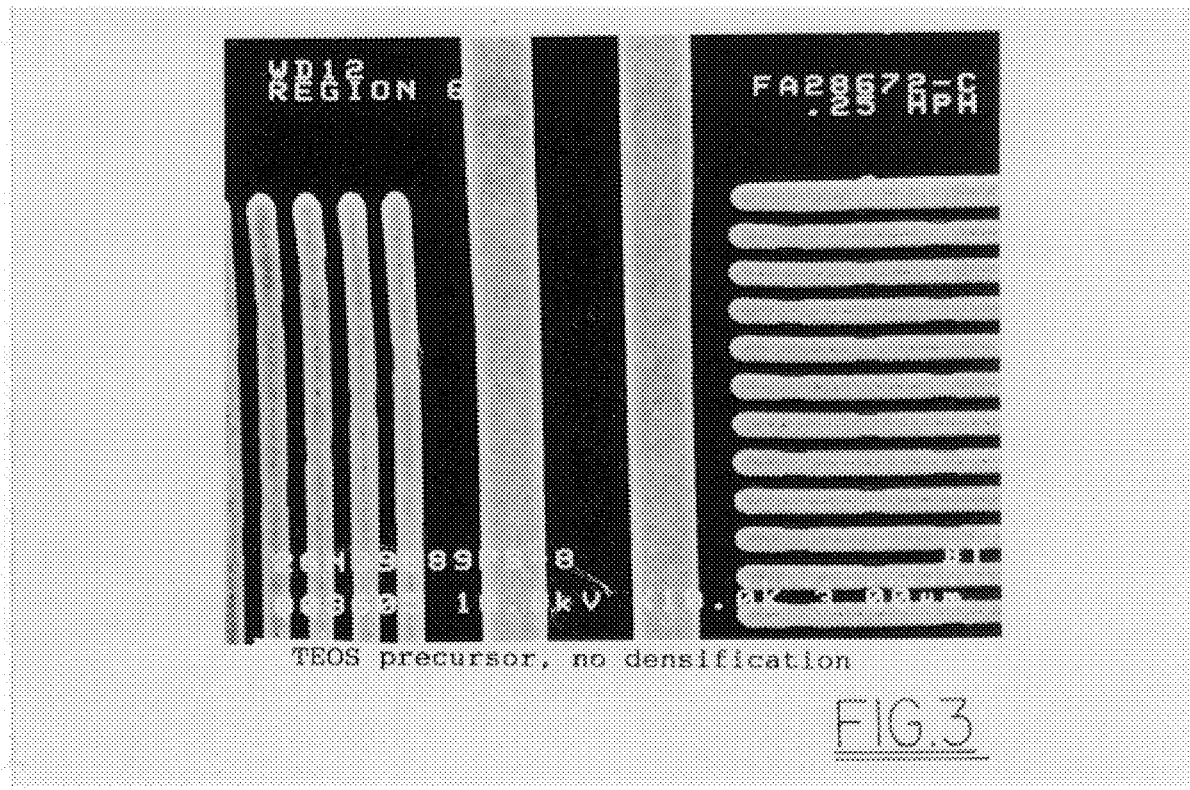
FIG. 3 is a scanning electron micrograph of lines formed using tetraethylorthosilicate as the precursor for plasma enhanced chemical vapor deposition of silicon dioxide, without using the method of the present invention.

The initial experiments revealed a number of problems with the dual damascene structures using undoped $SiO_2$ on BPSG. The most serious problem was severe distortion of the contacts and the interconnects as shown in FIGS. 1 and 3. The tops of the contacts were tilted and the interconnects were bent or widened. The tilting of the studs did not cause any observable problems with contact resistance or contact chain continuity, but could potentially cause problems with yield or reliability. The distortion of the interconnects causes an increase in linewidth, and hence a decrease in sheet resistance of isolated lines.

Figure 2:
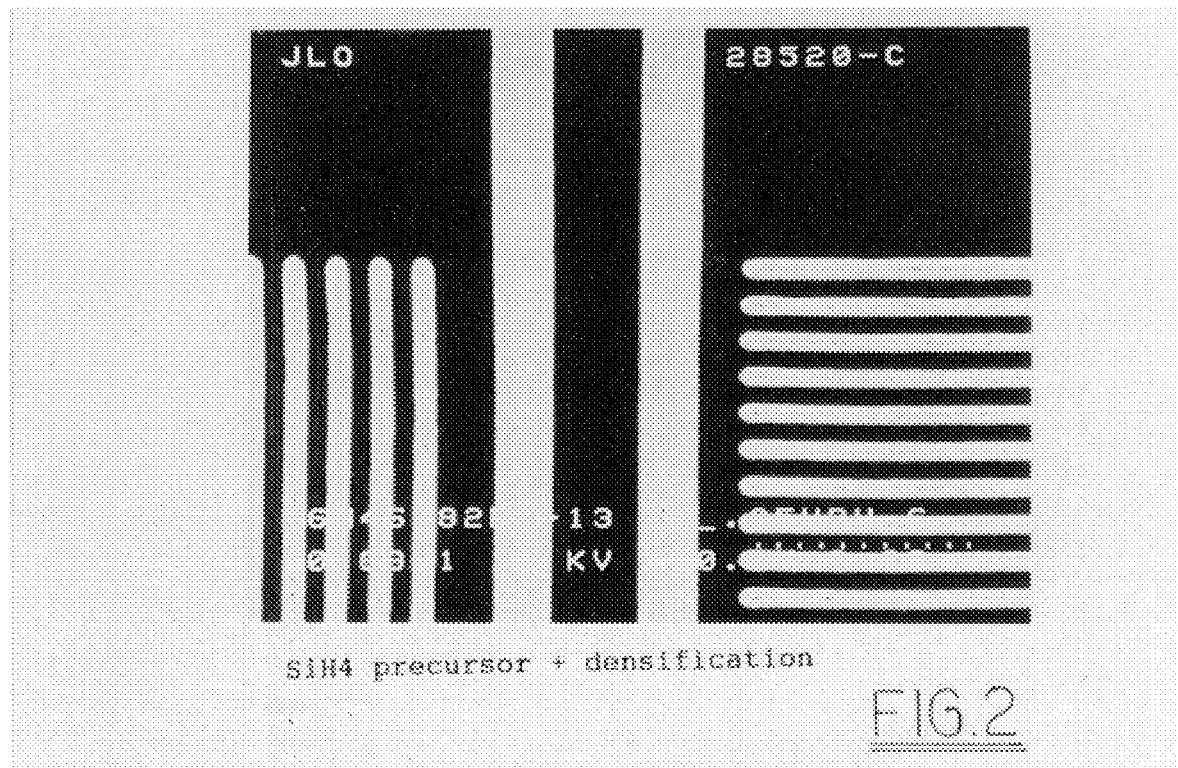
FIG. 2 is a scanning electron micrograph of lines formed using silane as the precursor for plasma enhanced chemical vapor deposition of silicon dioxide, with the method of the present invention.
Figure 4:
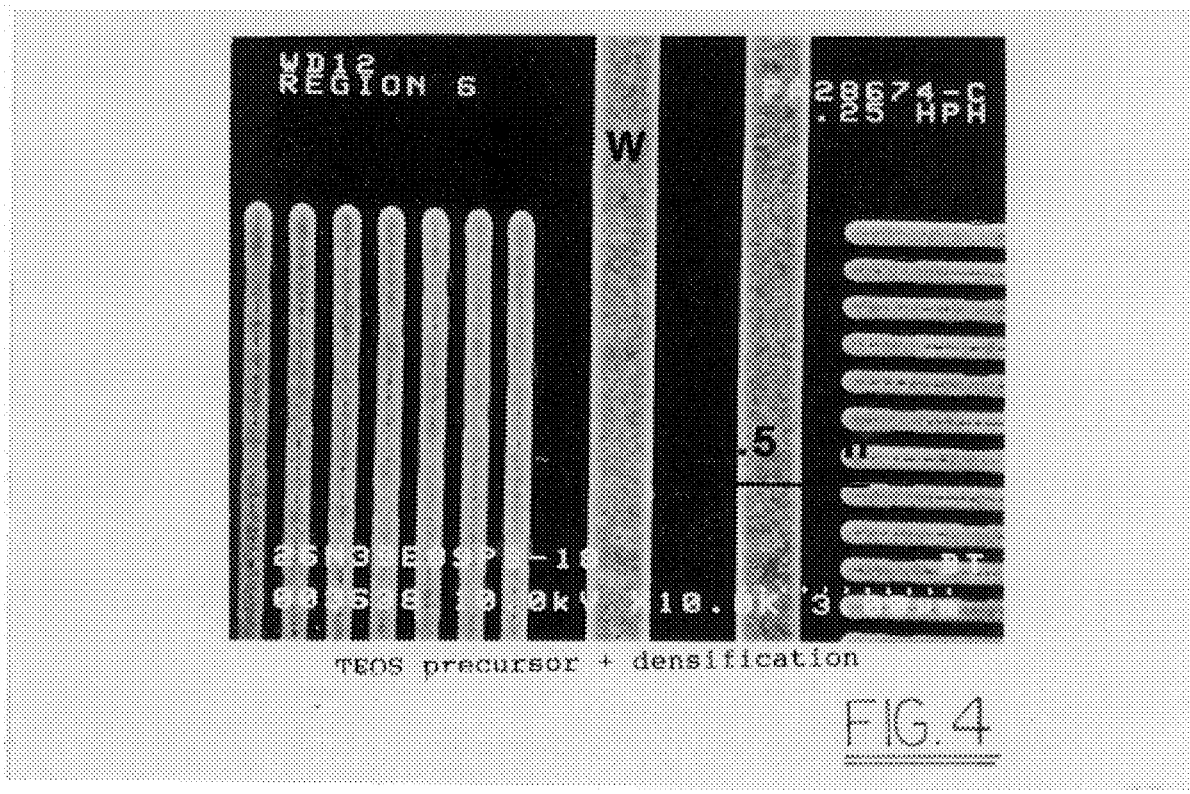
FIG. 4 is a scanning electron micrograph of lines formed using tetraethylorthosilicate as the precursor for the plasma enhanced chemical vapor deposition of silicon dioxide, with the method of the present invention.
Figure 5:
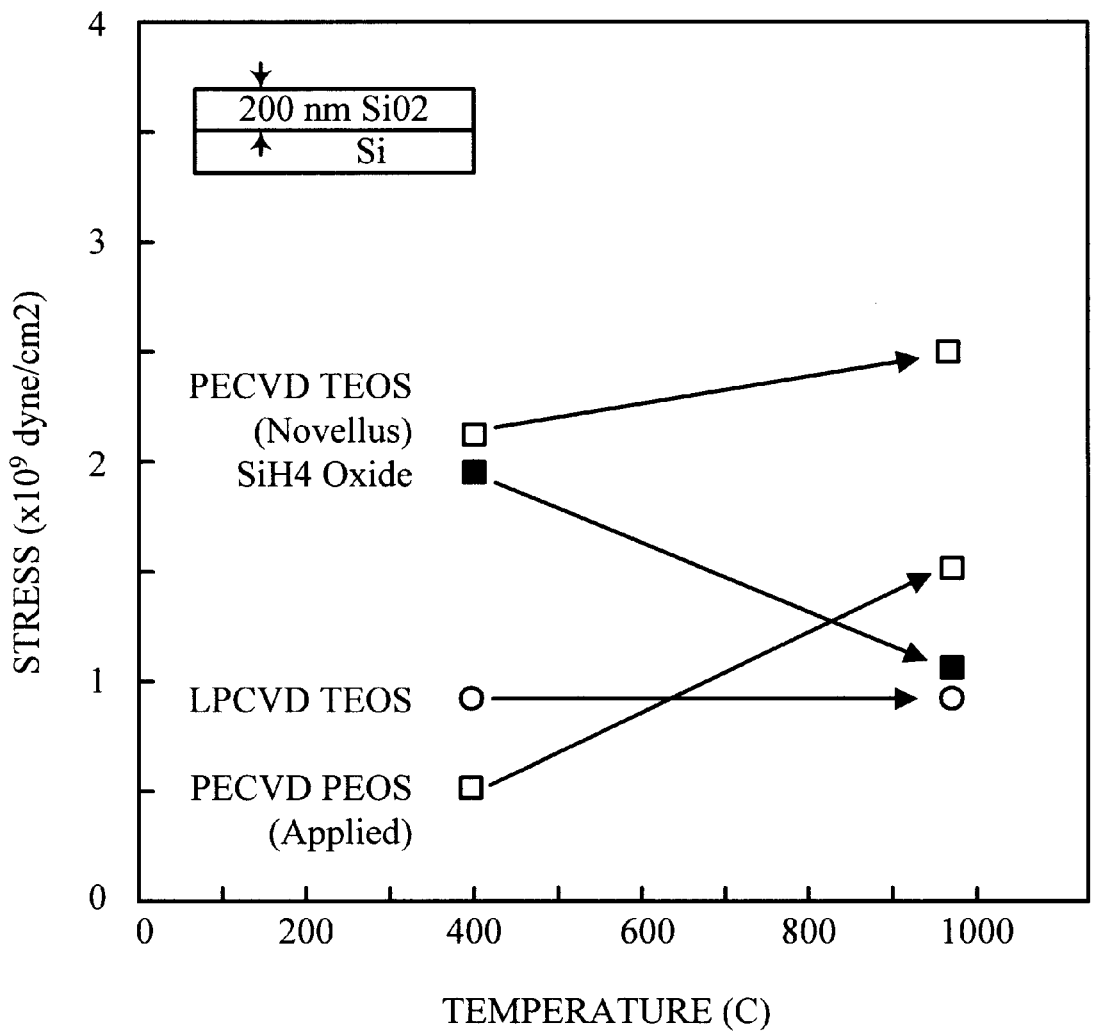
FIG. 5 is a graphic representation of the relative changes in stress for various compositions as a function of temperature.

The distortion of the structure is probably associated with densification of the undoped $SiO_2$ during a contact anneal. The stress in the undoped $SiO_2$/BPSG film stack becomes less compressive (i.e., more tensile) after the high temperature anneal, consistent with shrinkage of the undoped $SiO_2$ film as shown in FIG. 5. Because the high temperature anneal is above the BPSG reflow temperature, the shrinkage of the undoped $SiO_2$ results in lateral motion of the interconnect and stud patterns. The amount of lateral motion depends on the surrounding structures, and is greatest for interconnects or contacts adjacent to large unpatterned $SiO_2$ regions. In fact, it appears that the lines are being pulled toward the center of a large unpatterned region. The problem is solved by densifying the $SiO_2$ before patterning, as shown in FIGS. 2 and 4. This eliminates any shrinkage and lateral motion of the pattern during the contact anneal.

Additionally, the deposition method influences the shrinkage of the $SiO_2$. One variable that affects the shrinkage is the precursor for $SiO_2$ deposition. As can be seen by comparing FIGS. 1 and 2, the $SiO_2$ formed from a silane precursor has more curvature than that formed from a TEOS precursor. Further, the annealing of the $SiO_2$ produced from the silane precursor does not result in the same benefits, i.e., the straighter lines, as the annealing of $SiO_2$ produced from tetraethylorthosilicate (TEOS) precursor, as shown in FIGS. 3 and 4 and as illustrated graphically in FIG. 5.

This invention has been described in terms of specific instruments set forth in detail. It should be understood, however, that these embodiments are presented by way of illustration only, and that the invention is not necessarily limited thereto. Modifications and variations within the spirit and scope of the claims that follow will be readily apparent from this disclosure, as those skilled in the art will appreciate.

We claim:

1. An integrated circuit chip comprising:
    a substrate;
    a layer of highly conformal dielectric material on a surface of said substrate;
    a layer of high temperature densified dielectric material on a surface of said highly conformal layer, said densified dielectric material having a relatively low polishing rate compared to said highly conformal dielectric material, and said layer of high temperature material being formed in a temperature range of about 800° C. to about 1100° C.;

a plurality of contact junctions in said substrate, said contact junctions being formed by ion implantation followed by post-implantation annealing; and interconnect metallization coupled to said contact junctions through said densified and highly conformal dielectric layers and formed in troughs etched into said densified dielectric layer, wherein said troughs were exposed to said post-implantation annealing yet substantially conform in position and dimension to a predetermined pattern.

2. The integrated circuit chip of claim 1, wherein said interconnect metallization is coupled to said contact junctions by a plurality of metal studs formed in contact holes etched through said densified and highly conformal dielectric layers to said contact junctions in said substrate, said contact junctions being formed by ion implantation through said contact holes followed by post-implantation annealing, wherein said contact holes were exposed to said post-implantation annealing yet substantially conform in position and dimension to a predetermined pattern.

3. The integrated circuit chip of claim 2, wherein said interconnect metallization and metal studs substantially conform in position and dimension to a predetermined pattern.

4. The integrated circuit chip of claim 1 wherein said densified dielectric material layer is formed by depositing a silicon dioxide layer on said highly conformal dielectric material and heating said substrate to a temperature in the range of about 800° C. to 1100° C.

5. The integrated circuit chip of claim 1 wherein said highly conformal dielectric material is borophosphosilicate glass.

6. An integrated circuit chip comprising:

a substrate;

a layer of highly conformal dielectric material on a surface of said substrate;

a layer of heat shrinkage resistant dielectric material on a surface of said highly conformal layer, said heat shrinkage resistant dielectric material having a relatively low polishing rate compared to said highly conformal dielectric material, said heat shrinkage resistant dielectric material being an undoped silicon dioxide;

a plurality of contact junctions in said substrate, said contact junctions being formed by ion implantation followed by post-implantation annealing; and interconnect metallization coupled to said contact junctions through said heat shrinkage resistant and highly conformal dielectric layers and formed in troughs etched into said heat shrinkage resistant dielectric layer, wherein said troughs were exposed to said post-implantation annealing yet substantially conform in position and dimension to a predetermined pattern.

7. The integrated circuit chip of claim 6, wherein said interconnect metallization is coupled to said contact junctions by a plurality of metal studs formed in contact holes etched through said heat shrinkage resistant and highly conformal dielectric layers to said contact junctions in said substrate, said contact junctions being formed by ion implantation through said contact holes followed by post-implantation annealing, wherein said contact holes were exposed to said post-implantation annealing yet substantially conform in position and dimension to a predetermined pattern.

8. The integrated circuit chip of claim 7, wherein said interconnect metallization and metal studs substantially conform in position and dimension to a predetermined pattern.

9. The integrated circuit chip of claim 7 wherein said heat shrinkage resistant dielectric material layer is densified prior to formation of said contact holes or troughs by depositing said heat shrinkage resistant dielectric material on said highly conformal dielectric material and heating said substrate to a temperature in the range of about 800° C. to 1100° C.

10. The integrated circuit chip of claim 6 wherein said highly conformal dielectric material is borophosphosilicate glass.

11. The integrated circuit chip of claim 6 wherein said heat shrinkage resistant dielectric material is silicon dioxide deposited from a tetraethyl orthosilicate (TEOS) precursor.

12. An integrated circuit chip comprising:

a substrate;

a layer of highly conformal dielectric material on a surface of said substrate;

a layer of heat shrinkage resistant dielectric material on a surface of said highly conformal layer, said heat shrinkage resistant dielectric material being relatively resistant to polishing erosion compared to said highly conformal dielectric material, said heat shrinkage resistant dielectric material being an undoped silicon dioxide;

metal studs formed by depositing a metal into contact holes lined with a barrier material and etched through said heat shrinkage resistant and highly conformal dielectric layers to contact junctions in said substrate, said contact junctions being formed by ion implantation through said contact holes followed by post-implantation annealing, wherein said contact holes were exposed to said post-implantation annealing yet substantially conform in position and dimension to a predetermined pattern; and interconnect metallization coupled to said contact junctions with said metal studs and formed by depositing a metal into troughs lined with a barrier material and etched into said heat shrinkage resistant dielectric layer, wherein said troughs were exposed to said post-implantation annealing yet substantially conform in position and dimension to a predetermined pattern.

13. The integrated circuit chip of claim 12, wherein said metal is tunsgten and said barrier material includes titanium.

14. The integrated circuit chip of claim 13, wherein said ion implantation is performed with materials selected from the group consisting of arsenic (As) and boron difluoride ($BF_2$).

15. An integrated circuit chip comprising:

a substrate;

a layer of highly conformal doped silicate glass on a surface of said substrate;

a layer of high temperature densified undoped $SiO_2$ on a surface of said highly conformal layer, said densified $SiO_2$ having a relatively low polishing rate compared to said doped silicate glass;

a plurality of contact junctions in said substrate, said contact junctions being formed by ion implantation followed by post-implantation annealing; and interconnect metallization coupled to said contact junctions through said densified and highly conformal layers and formed in troughs etched into said densified layer, wherein said troughs were exposed to said post-implantation annealing yet substantially conform in position and dimension to a predetermined pattern.

16. An integrated circuit chip comprising:

a substrate;

a layer of highly conformal doped silicate glass on a surface of said substrate;

a layer of heat shrinkage resistant undoped $SiO_2$ on a surface of said highly conformal layer, said heat shrinkage resistant $SiO_2$ having a relatively low polishing rate compared to said doped silicate glass;

a plurality of contact junctions in said substrate, said contact junctions being formed by ion implantation followed by post-implantation annealing; and interconnect metallization coupled to said contact junctions through said heat shrinkage resistant and highly conformal layers and formed in troughs etched into said heat shrinkage resistant layer, wherein said troughs were exposed to said post-implantation annealing yet substantially conform in position and dimension to a predetermined pattern.

17. An integrated circuit chip comprising:

a substrate;

a layer of highly conformal doped silicate glass on a surface of said substrate;

a layer of heat shrinkage resistant undoped $SiO_2$ on a surface of said highly conformal layer, said heat shrinkage resistant $SiO_2$ being relatively resistant to polishing erosion compared to said doped silicate glass;

metal studs formed by depositing a metal into contact holes lined with a barrier material and etched through said heat shrinkage resistant and highly conformal layers to contact junctions in said substrate, said contact junctions being formed by ion implantation through said contact holes followed by post-implantation annealing, wherein said contact holes were exposed to said post-implantation annealing yet substantially conform in position and dimension to a predetermined pattern; and interconnect metallization coupled to said contact junctions with said metal studs and formed by depositing a metal into troughs lined with a barrier material and etched into said heat shrinkage resistant layer, wherein said troughs were exposed to said post-implantation annealing yet substantially conform in position and dimension to a predetermined pattern.

\* \* \* \* \*